(12) United States Patent
Yanagi

(10) Patent No.: US 12,652,785 B2
(45) Date of Patent: Jun. 9, 2026

(54) COOLING SYSTEM

(71) Applicant: TOYOTA JIDOSHA KABUSHIKI KAISHA, Toyota (JP)

(72) Inventor: Takashi Yanagi, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 615 days.

(21) Appl. No.: 18/158,080

(22) Filed: Jan. 23, 2023

(65) Prior Publication Data

US 2023/0255007 A1 Aug. 10, 2023

(30) Foreign Application Priority Data

Feb. 9, 2022 (JP) ................................. 2022-018620

(51) Int. Cl.
*H05K 7/20* (2006.01)
*B60H 1/00* (2006.01)

(52) U.S. Cl.
CPC ..... *H05K 7/20945* (2013.01); *H05K 7/20845* (2013.01); *B60H 1/00385* (2013.01)

(58) Field of Classification Search
CPC ........... H05K 7/20945; H05K 7/20845; H05K 7/20927; B60H 1/00385; B60K 1/00; B60K 2001/003; H01M 8/04007; H01M 8/04358; H01M 8/04723
See application file for complete search history.

(56) References Cited

U.S. PATENT DOCUMENTS

2019/0178728 A1 6/2019 Kawaguchi et al.
2022/0196483 A1* 6/2022 Kobayashi ............... B60L 3/00

FOREIGN PATENT DOCUMENTS

| CN | 109792218 A | 5/2019 |
| JP | 2006-187105 A | 7/2006 |
| JP | 2009-284597 A | 12/2009 |
| JP | 2014-193001 A | 10/2014 |
| JP | 2020-141457 A | 9/2020 |
| JP | 2021-035214 A | 3/2021 |
| JP | 2021-044989 A | 3/2021 |
| WO | 2018/037472 A1 | 3/2018 |

* cited by examiner

*Primary Examiner* — Stephen D Meier
*Assistant Examiner* — Leo T Hinze
(74) *Attorney, Agent, or Firm* — Oliff PLC

(57) ABSTRACT
A cooling system includes a cooling path through which a heat medium flows in an order of the first unit and the second unit, a temperature sensor detecting a temperature of the heat medium flowing into the first unit, and a control device controlling operations of the first unit and the second unit. The control device is configured to execute a temperature estimation process for estimating a temperature of the heat medium flowing into the second unit. The temperature estimation process includes a process of acquiring the temperature detected by the temperature sensor, a process of calculating a temperature increase amount of the heat medium in the first unit, and a process of determining an estimated value of the temperature of the heat medium flowing into the second unit by adding the calculated temperature increase amount to the temperature detected by the temperature sensor.

3 Claims, 5 Drawing Sheets

COOLING SYSTEM

CROSS-REFERENCE TO RELATED APPLICATION

This application claims priority to Japanese Patent Application No. 2022-018620 filed on Feb. 9, 2022, incorporated herein by reference in its entirety.

BACKGROUND

1. Technical Field

The technology disclosed herein relates to a cooling system.

2. Description of Related Art

Japanese Unexamined Patent Application Publication No. 2009-284597 (JP 2009-284597 A) describes a cooling system for cooling a plurality of units. This cooling system includes a cooling path through which a heat medium flows over the units, and a temperature sensor for detecting a temperature of the heat medium flowing through the cooling path. For example, the flow rate of the heat medium is adjusted based on the temperature of the heat medium.

SUMMARY

In the cooling system described above, the heat medium sequentially flows through the units. Therefore, the temperature of the heat medium increases each time the heat medium passes through each unit. The temperature of the heat medium flowing into a further downstream unit increases more. To control the operation of each unit based on the temperature of the heat medium, it is necessary to grasp the temperature of the heat medium flowing into each unit. In this case, temperature sensors may be provided to the respective units, but the configuration is complicated.

In view of the above circumstances, the present specification provides a technology for grasping the temperature of the heat medium flowing into each unit with a simple configuration.

One aspect of the present disclosure provides a cooling system configured to cool a first unit and a second unit. The cooling system includes a cooling path through which a heat medium flows in an order of the first unit and the second unit, a temperature sensor configured to detect a temperature of the heat medium flowing into the first unit, and a control device connected to the temperature sensor and configured to control operations of the first unit and the second unit based on the temperature detected by the temperature sensor. The control device is configured to execute a temperature estimation process for estimating a temperature of the heat medium flowing into the second unit based on the temperature detected by the temperature sensor. The temperature estimation process includes a process of acquiring the temperature detected by the temperature sensor, a process of calculating a temperature increase amount of the heat medium in the first unit, and a process of determining an estimated value of the temperature of the heat medium flowing into the second unit by adding the calculated temperature increase amount to the temperature detected by the temperature sensor.

In the above configuration, the temperature of the heat medium flowing into the first unit is detected by the temperature sensor. The temperature of the heat medium flowing into the second unit is estimated by the temperature estimation process. Specifically, the estimated value of the temperature of the heat medium flowing into the second unit is determined by adding the temperature increase amount of the heat medium in the first unit to the temperature detected by the temperature sensor (that is, the temperature of the heat medium flowing into the first unit). With such a configuration, it is possible to grasp the temperatures of the heat medium flowing into the respective units with a simple configuration without providing the temperature sensors to both the first unit and the second unit.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein.

DETAILED DESCRIPTION OF EMBODIMENTS

Figure 1:
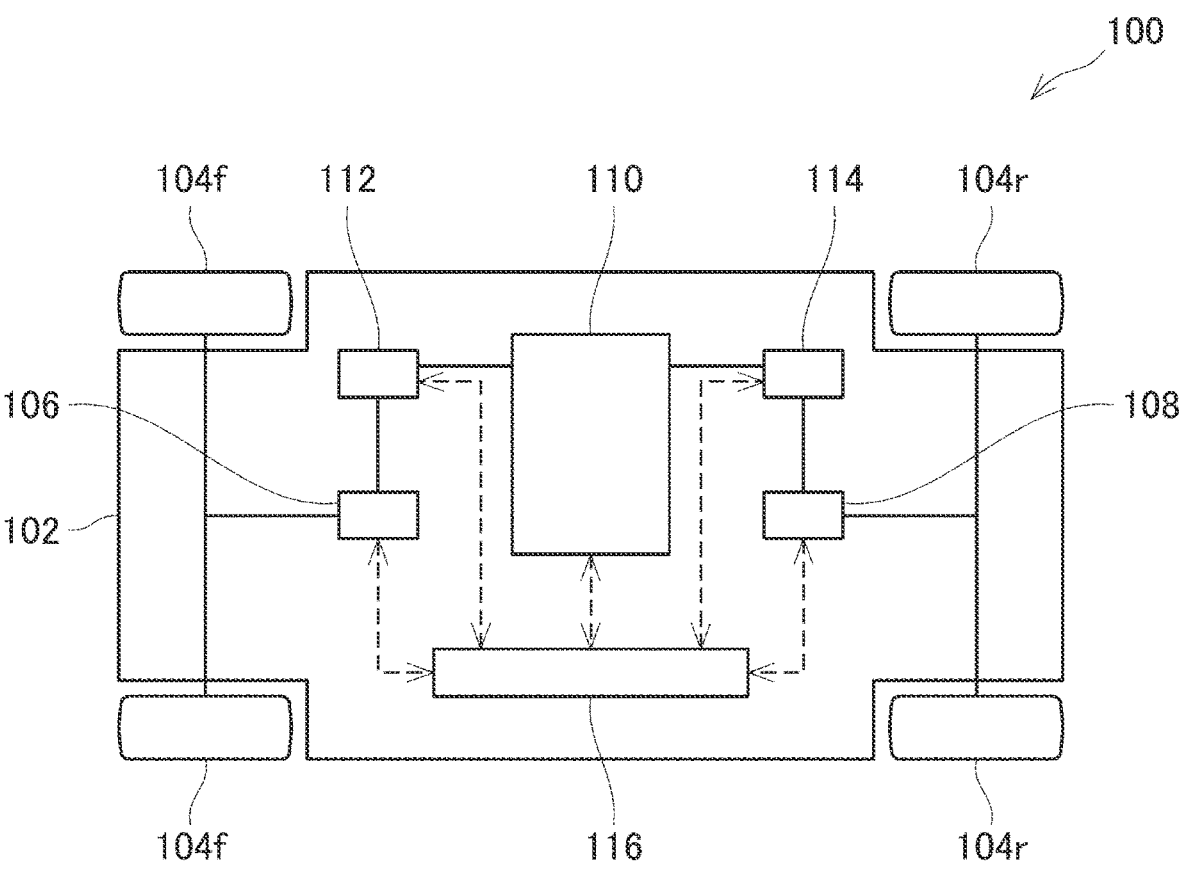
FIG. 1 is a diagram showing a main configuration of a vehicle 100 including a cooling system 10 according to an embodiment.

In the cooling system of the above aspect, in the process of calculating the temperature increase amount, the temperature increase amount may be calculated based on at least one of heat generation indices indicating an operation status of the first unit and at least one of cooling indices indicating a cooling status of the first unit using the heat medium. According to such a configuration, the temperature of the heat medium flowing into the second unit can be estimated based on the actual operation status and the actual cooling status of the first unit.

In the cooling system of the above aspect, the at least one of heat generation indices may include an operation command value for the first unit. According to such a configuration, the temperature increase amount can easily be calculated because detection noise need not be removed as compared to a case where the temperature increase amount is calculated based on a detection value obtained by detecting the operation status of the first unit. In another embodiment, the at least one of heat generation indices may include the detection value obtained by detecting the operation status of the first unit.

In the cooling system of the above aspect, the first unit may be a power conversion device configured to control electric power to be supplied to a motor. In this case, the operation command value may be a torque target value to be output by the motor. In the above power conversion device, it is considered that the torque target value to be output by the motor has a greater effect on heat generation in the power conversion device than the other operation command values. Therefore, the computation load on the control device can be reduced by calculating the temperature increase amount of the heat medium in the power conversion device based on the torque target value to be output by the motor without considering the other operation command values. In another embodiment, the temperature increase amount of the heat medium in the power conversion device may be calculated based on the other operation command values in addition to the torque target value to be output by the motor.

In the cooling system of the above aspect, the at least one of heat generation indices may include an operation parameter correlated to a power loss in the first unit. According to such a configuration, the temperature of the heat medium flowing into the second unit can be estimated based on the power loss in the first unit.

In the cooling system of the above aspect, the first unit may be a power conversion device configured to control electric power to be supplied to a motor. In this case, the operation parameter may include at least one of an input voltage to the power conversion device, an output current of the power conversion device, a carrier frequency of the power conversion device, and a control mode of the power conversion device. In the above power conversion device, it is considered that the at least one of the input voltage to the power conversion device, the output current of the power conversion device, the carrier frequency of the power conversion device, and the control mode of the power conversion device has a great effect on the temperature increase of the heat medium. Therefore, the computation load on the control device can be reduced by relatively reducing the operation parameters to be taken into consideration when calculating the temperature increase amount of the heat medium in the power conversion device.

In the cooling system of the above aspect, the at least one of heat generation indices may include an actual temperature detected in the first unit. According to such a configuration, the temperature of the heat medium flowing into the second unit can be estimated based on the actual temperature detected in the first unit.

In the cooling system of the above aspect, the first unit may be a power conversion device configured to control electric power to be supplied to a motor. In this case, the actual temperature may be an actual temperature detected by an element temperature sensor built in a semiconductor element provided in the power conversion device. It is considered that the heat generated from the semiconductor element has a great effect on the temperature increase of the heat medium during the operation of the power conversion device. Therefore, the computation load on the control device can be reduced by specifying the component to be taken into consideration when calculating the temperature increase amount of the heat medium in the power conversion device. The number of semiconductor elements provided in the power conversion device is not particularly limited, and may be at least one.

A cooling system 10 according to an embodiment and a vehicle 100 including the cooling system 10 will be described with reference to the drawings. The vehicle 100 is herein a so-called automobile that travels along a road. As shown in FIG. 1, the vehicle 100 includes a body 102 and a plurality of wheels 104f and 104r. The wheels 104f and 104r are rotatably attached to the body 102. The wheels 104f and 104r include a pair of front wheels 104f located at a front part of the body 102 and a pair of rear wheels 104r located at a rear part of the body 102. The front wheels 104f are disposed coaxially with each other, and the rear wheels 104r are also disposed coaxially with each other. The number of wheels 104f and 104r is not limited to four. Although there is no particular limitation, the body 102 is made of a metal such as steel or an aluminum alloy.

As shown in FIG. 1, the vehicle 100 further includes a front motor 106 and a rear motor 108. The front motor 106 is connected to the front wheels 104f, and can drive the front wheels 104f. The rear motor 108 is connected to the rear wheels 104r, and can drive the rear wheels 104r. That is, the vehicle 100 is capable of four-wheel drive. Although there is no particular limitation, each of the front motor 106 and the rear motor 108 of the present embodiment is a three-phase motor generator having a U phase, a V phase, and a W phase.

As shown in FIG. 1, the vehicle 100 further includes a battery 110. The battery 110 includes a plurality of secondary battery cells, and is repeatedly rechargeable with external electric power. Although there is no particular limitation, the battery 110 is a lithium-ion battery, a nickel metal hydride battery, or the like.

Figure 2:
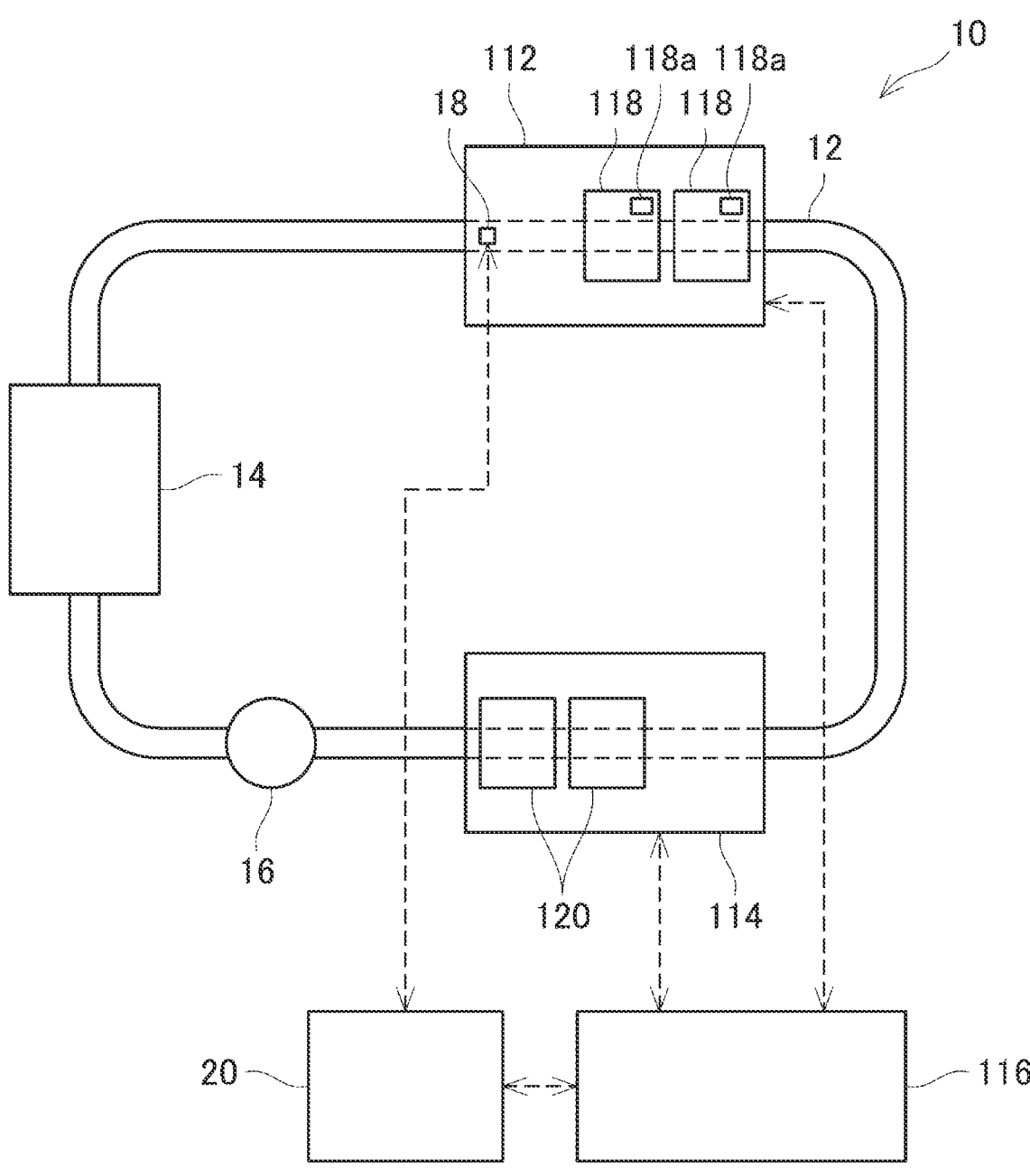
FIG. 2 is a diagram illustrating a configuration of the cooling system 10 according to the embodiment, and also showing a first power control unit (PCU) 112, a second PCU 114, and a control device 116 of the vehicle 100.

As shown in FIG. 1, the vehicle 100 further includes two power conversion devices (power control units; hereinafter referred to as "PCUs") 112 and 114. The two PCUs 112 and 114 can control power supply to the corresponding motors 106 and 108. The two PCUs 112 and 114 include a first PCU 112 and a second PCU 114. The first PCU 112 is provided between the battery 110 and the front motor 106. The first PCU 112 is an inverter and includes a plurality of semiconductor elements 118 (see FIG. 2). The first PCU 112 can convert direct-current (DC) power from the battery 110 into alternating-current (AC) power, and supply the AC power to the front motor 106. The first PCU 112 can also convert AC power generated by the front motor 106 into DC power, and supply the DC power to the battery 110. That is, the vehicle 100 can charge the battery 110 by supplying regenerative power from the front motor 106 to the battery 110 during braking. The first PCU 112 may further include a DC-DC converter in addition to the inverter. As shown in FIG. 2, the semiconductor element 118 of the first PCU 112 includes an element temperature sensor 118a for detecting its temperature.

The second PCU 114 is provided between the battery 110 and the rear motor 108. The second PCU 114 is an inverter and includes a plurality of semiconductor elements 120 (see FIG. 2). The second PCU 114 can convert DC power from the battery 110 into AC power, and supply the AC power to the rear motor 108. The second PCU 114 can also convert AC power generated by the rear motor 108 into DC power, and supply the DC power to the battery 110. That is, the vehicle 100 can charge the battery 110 by supplying regenerative power from the rear motor 108 to the battery 110 during braking. The second PCU 114 may further include a DC-DC converter in addition to the inverter.

As shown in FIG. 1, the vehicle 100 further includes a control device 116. The control device 116 is a computer device including a processor, a memory, and the like. The control device 116 may be a single computer device or a combination of a plurality of computer devices. The control device 116 is connected to the front motor 106, the rear motor 108, the battery 110, the first PCU 112, and the second PCU 114 so that the control device 116 can communicate therewith, and can monitor and control operations thereof. For example, operation information indicating an operation performed by a user and vehicle information indicating a state of the vehicle 100 are input to the control device 116. The control device 116 controls the operation of each part of the vehicle 100 based on the received operation information and the received vehicle information. For example, the control device 116 can determine torque target values for the front motor 106 and the rear motor 108 based on the input operation information and the input vehicle information. The control device 116 can control the operations of the first PCU 112 and the second PCU 114 by feedback control so that actual torques output from the motors 106 and 108 are equal to the torque target values.

Next, the cooling system 10 according to the embodiment will be described. The cooling system 10 according to the embodiment cools the first PCU 112 and the second PCU 114. As shown in FIG. 2, the cooling system 10 includes a cooling path 12, a radiator 14, and a pump 16. The cooling path 12 is a path through which a heat medium flows. The heat medium may be, for example, a coolant. The radiator 14 can exchange heat between the heat medium and outside air and dissipate heat from the heat medium. The pump 16 is provided in the cooling path 12, and can adjust the flow rate of the heat medium flowing through the cooling path 12. The cooling path 12 is connected to the radiator 14, the first PCU 112, and the second PCU 114. The heat medium flows in an order of the first PCU 112 and the second PCU 114 to collect heat from the first PCU 112 and the second PCU 114. Therefore, the temperature of the heat medium increases as the heat medium passes through the first PCU 112 and the second PCU 114. The temperature of the heat medium decreases when the radiator 14 dissipates heat from the heat medium.

Figure 3:
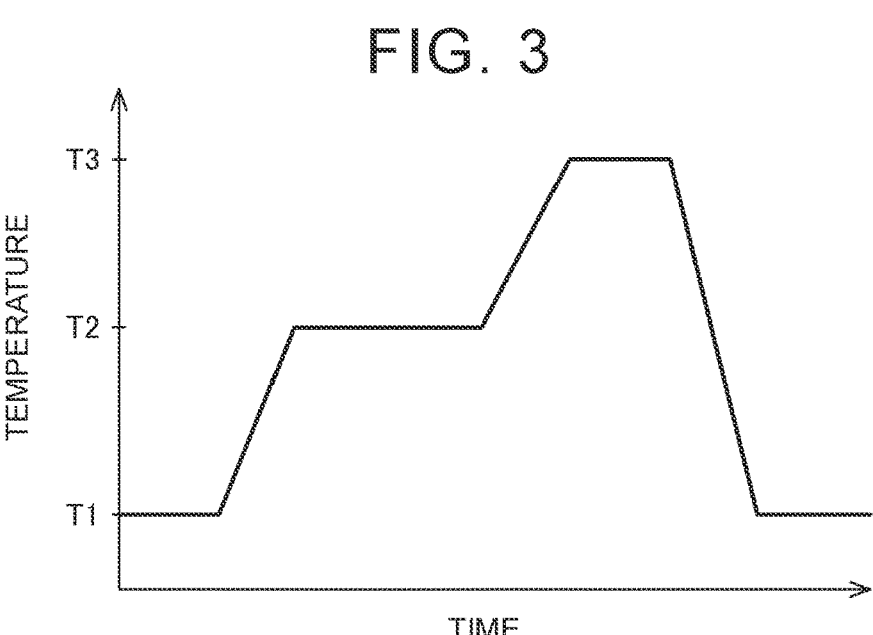
FIG. 3 is a diagram illustrating temperatures of a heat medium flowing through a cooling path 12, in which a first temperature T1 is a temperature of the heat medium immediately after passing through a radiator 14, a second temperature T2 is a temperature of the heat medium flowing out of the first PCU 112, a third temperature T3 is a temperature of the heat medium flowing out of the second PCU 114, the first temperature T1 agrees with a temperature of the heat medium flowing into the first PCU 112, and the second temperature T2 agrees with a temperature of the heat medium flowing into the second PCU 114.

Regarding the above matter, a temperature change of the heat medium when the heat medium flows through the cooling path 12 will be described with reference to FIG. 3. The heat medium immediately after passing through the radiator 14 has a first temperature T1. The first temperature T1 is approximately equal to an outside air temperature. The heat medium then flows into the first PCU 112 while keeping the first temperature T1. When the heat medium flows through the first PCU 112, the heat medium collects heat from the first PCU 112. Therefore, the temperature of the heat medium increases to a second temperature T2. When the heat medium then flows through the second PCU 114, the heat medium collects heat from the second PCU 114. Therefore, the temperature of the heat medium increases to a third temperature T3. When the heat medium reaches the radiator 14, the heat is dissipated from the heat medium through heat exchange by the radiator 14. Therefore, the temperature of the heat medium decreases to the first temperature T1. As described above, the cooling system 10 can manage the temperatures of the first PCU 112 and the second PCU 114 by collecting the heat from the first PCU 112 and the second PCU 114 and dissipating the heat from the radiator 14 to the outside.

As shown in FIG. 2, the cooling system 10 further includes a temperature sensor 18. The temperature sensor 18 detects a temperature of the heat medium flowing into the first PCU 112. For example, the temperature sensor 18 is provided in the first PCU 112. In another embodiment, the temperature sensor 18 may be provided at a part where the temperature is substantially equal to the temperature of the heat medium flowing into the first PCU 112. For example, in a case where the temperature of the heat medium is assumed to be unchanged between a timing immediately after the passage through the radiator 14 to a timing of the inflow to the first PCU 112 as in the present embodiment, the temperature sensor 18 may be provided at any part between the radiator 14 and the first PCU 112.

As shown in FIG. 2, the cooling system 10 further includes a cooling control device 20. The cooling control device 20 is a computer device including a processor, a memory, and the like, and controls and monitors the operation of the cooling system 10. The cooling control device 20 may be a single computer device or a combination of a plurality of computer devices. The cooling control device 20 is connected to the temperature sensor 18 so that the cooling control device 20 can communicate with the temperature sensor 18, and can acquire a temperature detected by the temperature sensor 18. In addition, the cooling control device 20 is connected to the control device 116 of the vehicle 100 so that the cooling control device 20 can communicate with the control device 116, and can acquire the operation information and the vehicle information input to the control device 116. Although details will be described later, the cooling control device 20 is configured to execute a temperature estimation process for estimating a temperature of the heat medium flowing into the second PCU 114 based on the temperature detected by the temperature sensor 18 and the information acquired from the control device 116. The control device 116 acquires the temperature detected by the temperature sensor 18 and the estimated value obtained by the temperature estimation process from the cooling control device 20, and controls the operations of the first PCU 112 and the second PCU 114 based on the detected temperature and the estimated value.

The two cooling targets of the cooling system 10 need not essentially be the first PCU 112 and the second PCU 114. In another embodiment, the cooling system 10 may cool either one of the PCUs 112 and 114 and another heat source (for example, an engine). In still another embodiment, two other heat sources may be cooled.

Figure 4:
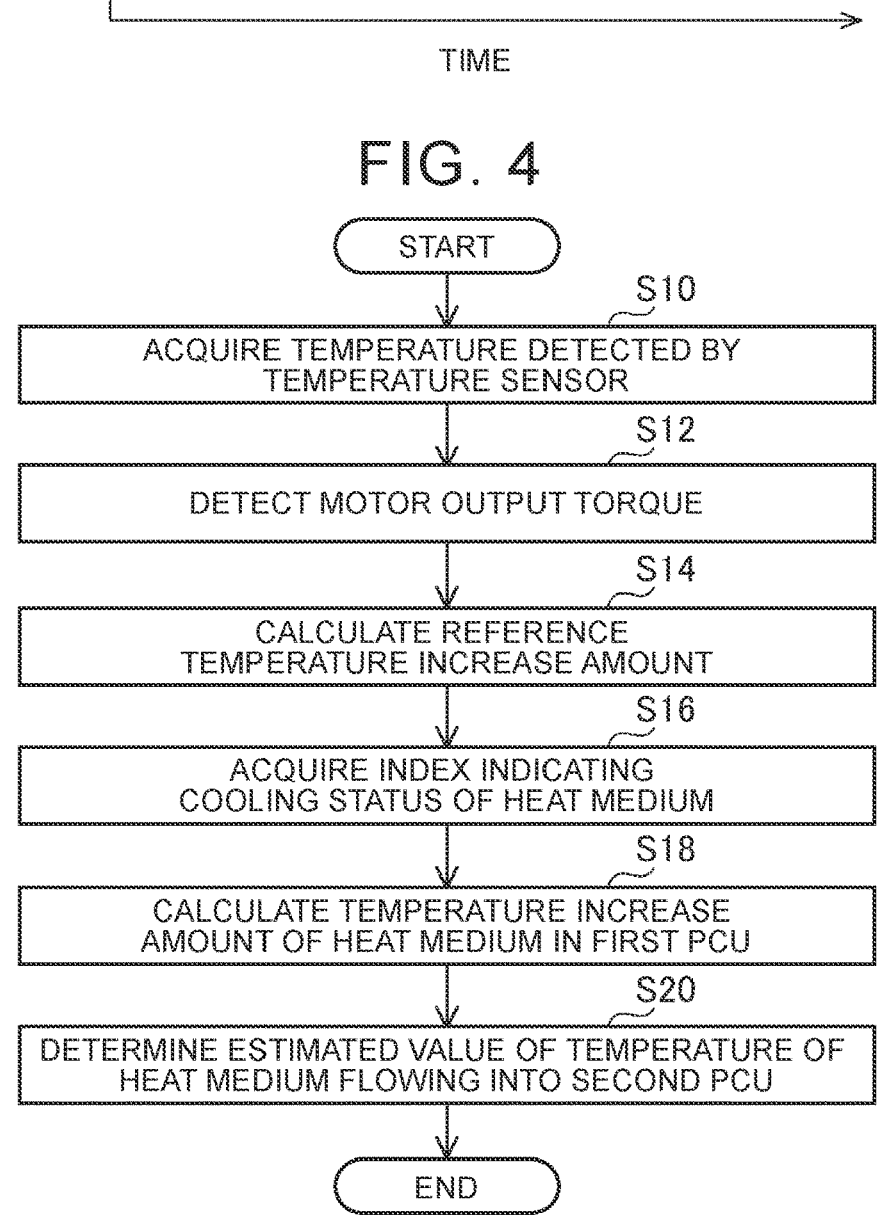
FIG. 4 is a flowchart showing an example of a temperature estimation process to be executed by a cooling control device 20.

Next, the temperature estimation process to be executed by the cooling control device 20 will be described with reference to FIG. 4. In Step S10, the cooling control device 20 acquires a temperature detected by the temperature sensor 18. As described above, the temperature sensor 18 detects the temperature of the heat medium flowing into the first PCU 112. Therefore, the temperature acquired by the cooling control device 20 in Step S10 is the temperature of the heat medium flowing into the first PCU 112.

In Step S12, the cooling control device 20 communicates with the control device 116 of the vehicle 100 to detect a torque target value to be output by the front motor 106. The torque target value to be output by the front motor 106 is an example of an operation command value for the first PCU 112 and an example of a heat generation index indicating the operation status of the first PCU 112. In another embodiment, the cooling control device may detect an actual torque output by the front motor 106 by using a sensor or the like instead of the torque target value to be output by the front motor 106.

In Step S14, the cooling control device 20 calculates a reference temperature increase amount of the heat medium in the first PCU 112 based on the torque target value detected in Step S12. The reference temperature increase amount means an amount of increase in the temperature of the heat medium that may occur in the first PCU 112 under the assumption that the flow rate of the heat medium is a predetermined reference flow rate. To calculate the reference temperature increase amount, the cooling control device 20 stores the maximum value of the reference temperature increase amount. The maximum value of the reference temperature increase amount means an amount of increase in the temperature of the heat medium that may occur in the first PCU 112 when the flow rate of the heat medium is the predetermined reference flow rate and the torque target value of the front motor 106 is set to the maximum value. The maximum value of the reference temperature increase amount is an index determined based on the specific configuration of the vehicle 100 including the cooling system 10, and can be determined in advance through experiments or simulations. The cooling control device 20 can calculate the reference temperature increase amount based on a relational expression of "reference temperature increase amount"="maximum value of reference temperature increase amount"×("torque target value detected in Step S12"/"maximum value of torque target value").

In Step S16, the cooling control device 20 acquires a cooling index indicating the cooling status of the first PCU 112 using the heat medium. The cooling index indicating the cooling status of the first PCU 112 using the heat medium includes, for example, the flow rate of the heat medium. Although there is no particular limitation, in the present embodiment, the pump 16 adjusts the flow rate of the heat medium in response to an operation command transmitted from the cooling control device 20. Therefore, the cooling control device 20 can determine the flow rate of the heat medium based on the operation command value set for the pump 16 by the cooling control device 20. In another embodiment, the cooling control device 20 may acquire an actual flow rate of the heat medium by using a sensor or the like.

In Step S18, the cooling control device 20 calculates a temperature increase amount of the heat medium in the first PCU 112. For example, the temperature increase amount of the heat medium in the first PCU 112 can be calculated based on a relational expression of "temperature increase amount of heat medium"="reference temperature increase amount"×("reference flow rate"/"flow rate of heat medium") by using the reference temperature increase amount calculated in Step S14 and the flow rate of the heat medium acquired in Step S16.

In Step S20, the cooling control device 20 determines an estimated value of the temperature of the heat medium flowing into the second PCU 114. Specifically, the estimated value of the temperature of the heat medium flowing into the second PCU 114 is determined by adding the temperature increase amount of the heat medium in Step S18 to the temperature detected by the temperature sensor 18 in Step S10.

In the above configuration, the temperature of the heat medium flowing into the first PCU 112 (corresponding to the first temperature T1 in FIG. 3) is detected by the temperature sensor 18. The temperature of the heat medium flowing into the second PCU 114 is estimated by the temperature estimation process. Specifically, the estimated value of the temperature of the heat medium flowing into the second PCU 114 (corresponding to the second temperature T2 in FIG. 3) is determined by adding the temperature increase amount of the heat medium in the first PCU 112 to the temperature detected by the temperature sensor 18 (that is, the temperature of the heat medium flowing into the first PCU 112). With such a configuration, it is possible to grasp the temperatures of the heat medium flowing into the PCUs 112 and 114 with a simple configuration without providing the temperature sensors 18 to both the first PCU 112 and the second PCU 114.

In the above configuration, it is considered that the torque target value to be output by the front motor 106 has a greater effect on heat generation in the first PCU 112 than the other operation command values during the operation of the first PCU 112. Therefore, in the series of steps in the temperature estimation process shown in FIG. 4, the temperature increase amount of the heat medium in the first PCU 112 is calculated based on the torque target value to be output by the front motor 106. According to such a configuration, the computation load on the cooling control device 20 can be reduced by calculating the temperature increase amount of the heat medium in the first PCU 112 based on the torque target value to be output by the front motor 106 without considering the other operation command values.

Although there is no particular limitation, in the temperature estimation process described above, the cooling control device 20 may consider the other heat generation indices in addition to the torque target value to be output by the front motor 106. Examples of the heat generation indices that affect the heat generation amount of the first PCU 112 include, in addition to the torque output by the front motor 106, an input voltage to the first PCU 112, a current flowing through the first PCU 112, a carrier frequency of the first PCU 112, and a control mode of the first PCU 112. When calculating the reference temperature increase amount in Step S14, the cooling control device 20 may further specify one or more of these heat generation indices, and correct the reference temperature increase amount based on the specified heat generation index.

The cooling control device 20 need not essentially calculate the temperature increase amount of the heat medium in the first PCU 112 based on the torque target value to be output by the front motor 106. That is, the cooling control device 20 may calculate the temperature increase amount of the heat medium in the first PCU 112 based on at least one of heat generation indices indicating the operation status of the first PCU 112. The at least one of heat generation indices indicating the operation status of the first PCU 112 includes not only the operation command value for the first PCU 112 described above, but also an operation parameter correlated to a power loss in the first PCU 112 and an actual temperature detected in the first PCU 112. As modifications of the estimation process shown in FIG. 4, a temperature estimation process for calculating the temperature increase amount of the heat medium in the first PCU 112 based on the operation parameter correlated to the power loss in the first PCU 112 or the actual temperature detected in the first PCU 112 will be described below with reference to FIGS. 5 and 6.

Figure 5:
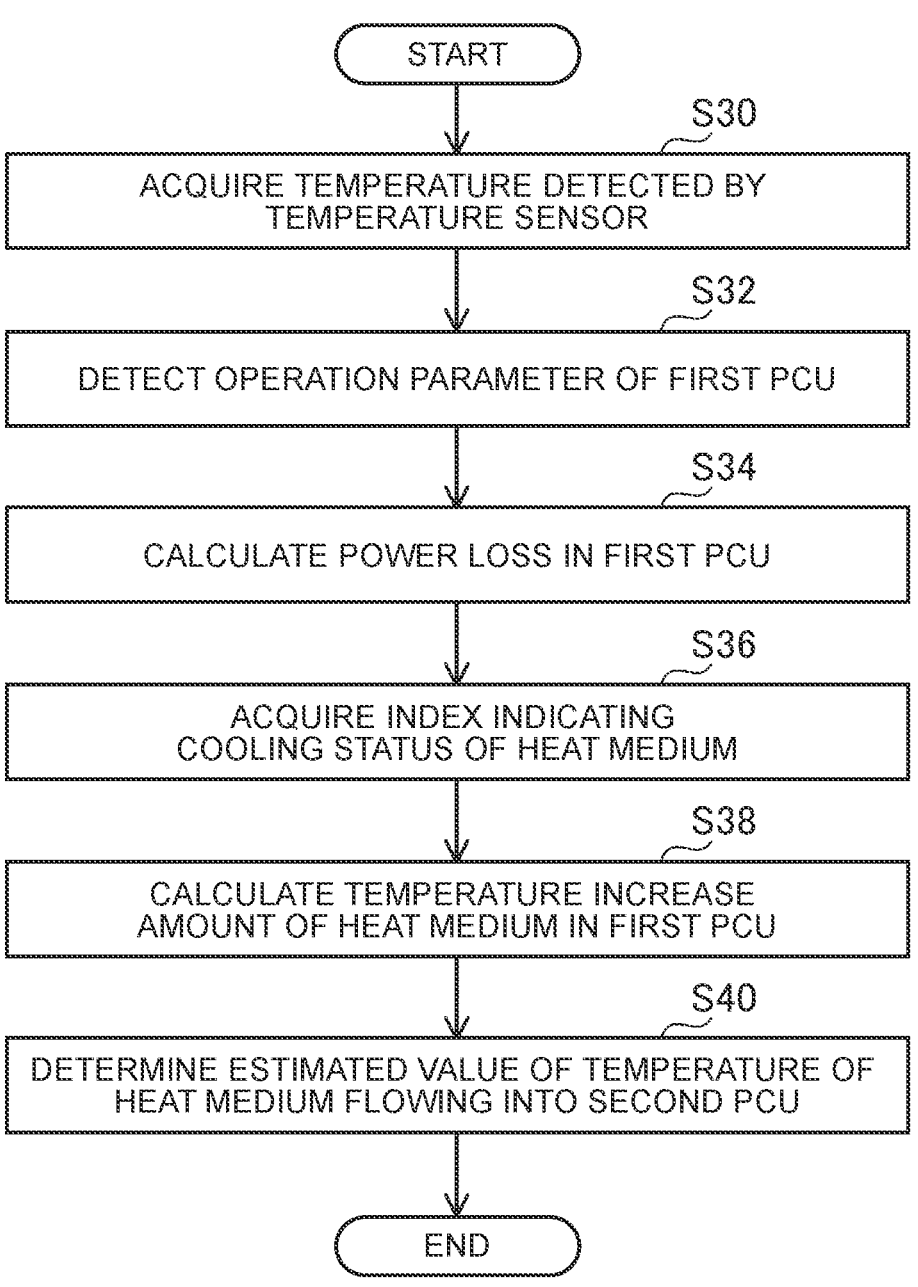
FIG. 5 is a flowchart showing a modification of the temperature estimation process to be executed by the cooling control device 20.

In the temperature estimation process shown in FIG. 5, the temperature increase amount of the heat medium in the first PCU 112 is calculated based on the operation parameter correlated to the power loss in the first PCU 112. The temperature estimation process of FIG. 5 is a modification of a part of the temperature estimation process shown in FIG. 4, specifically, the process of calculating the temperature increase amount of the heat medium in the first PCU 112 (that is, the process of Steps S12 to S18). Therefore, Steps S32 to S38 of FIG. 5 will be described below. Steps S30 and S40 of FIG. 5 are the same as Steps S10 and S20 of FIG. 4.

In Step S32, the cooling control device 20 communicates with the control device 116 of the vehicle 100 to detect the operation parameter correlated to the power loss in the first PCU 112. The operation parameter includes at least one of an input voltage to the first PCU 112, an output current of the first PCU 112, a carrier frequency of the first PCU 112, and a control mode of the first PCU 112. These operation parameters may be operation command values or detection values obtained by detecting actual operation statuses. Since the first PCU 112 in the present embodiment is the inverter as described above, the power loss in the first PCU 112 in Step S32 means a power loss in the inverter.

In Step S34, the cooling control device 20 calculates the power loss in the first PCU 112. For example, the cooling control device 20 can prestore a relational expression or a map that describes a relationship between the power loss in the first PCU 112 and the operation parameter correlated to the power loss in the first PCU 112. Therefore, the cooling control device 20 can calculate the power loss in the first PCU 112 based on the operation parameter detected in Step S32 and the relational expression or the map.

In Step S36, the cooling control device 20 acquires a cooling index indicating the cooling status of the first PCU 112 using the heat medium. The cooling index indicating the cooling status of the first PCU 112 using the heat medium includes, for example, the flow rate of the heat medium. Step S36 is the same as Step S16 of FIG. 4.

In Step S38, the cooling control device 20 calculates a temperature increase amount of the heat medium in the first PCU 112. For example, the temperature increase amount of the heat medium in the first PCU 112 can be obtained by dividing the power loss in the first PCU 112 calculated in Step S34 by a heat capacity of the heat medium passing through the first PCU 112. That is, the temperature increase amount of the heat medium can be calculated based on a relational expression of "temperature increase amount of heat medium"="power loss in first PCU 112"/("density of heat medium"×"specific heat of heat medium"×"flow rate of heat medium acquired in Step S36").

In the above configuration, it is considered that the operation parameter correlated to the power loss in the first PCU 112 has a great effect on the temperature increase of the heat medium during the operation of the first PCU 112. The operation parameter correlated to the power loss in the first PCU 112 includes at least one of the input voltage to the first PCU 112, the output current of the first PCU 112, the carrier frequency of the first PCU 112, and the control mode of the first PCU 112. In the series of steps in the temperature estimation process shown in FIG. 5, the temperature increase amount of the heat medium in the first PCU 112 is calculated based on the operation parameter correlated to the power loss in the first PCU 112. According to such a configuration, the computation load on the cooling control device 20 can be reduced by relatively reducing the operation parameters to be taken into consideration when calculating the temperature increase amount of the heat medium in the first PCU 112.

Figure 6:
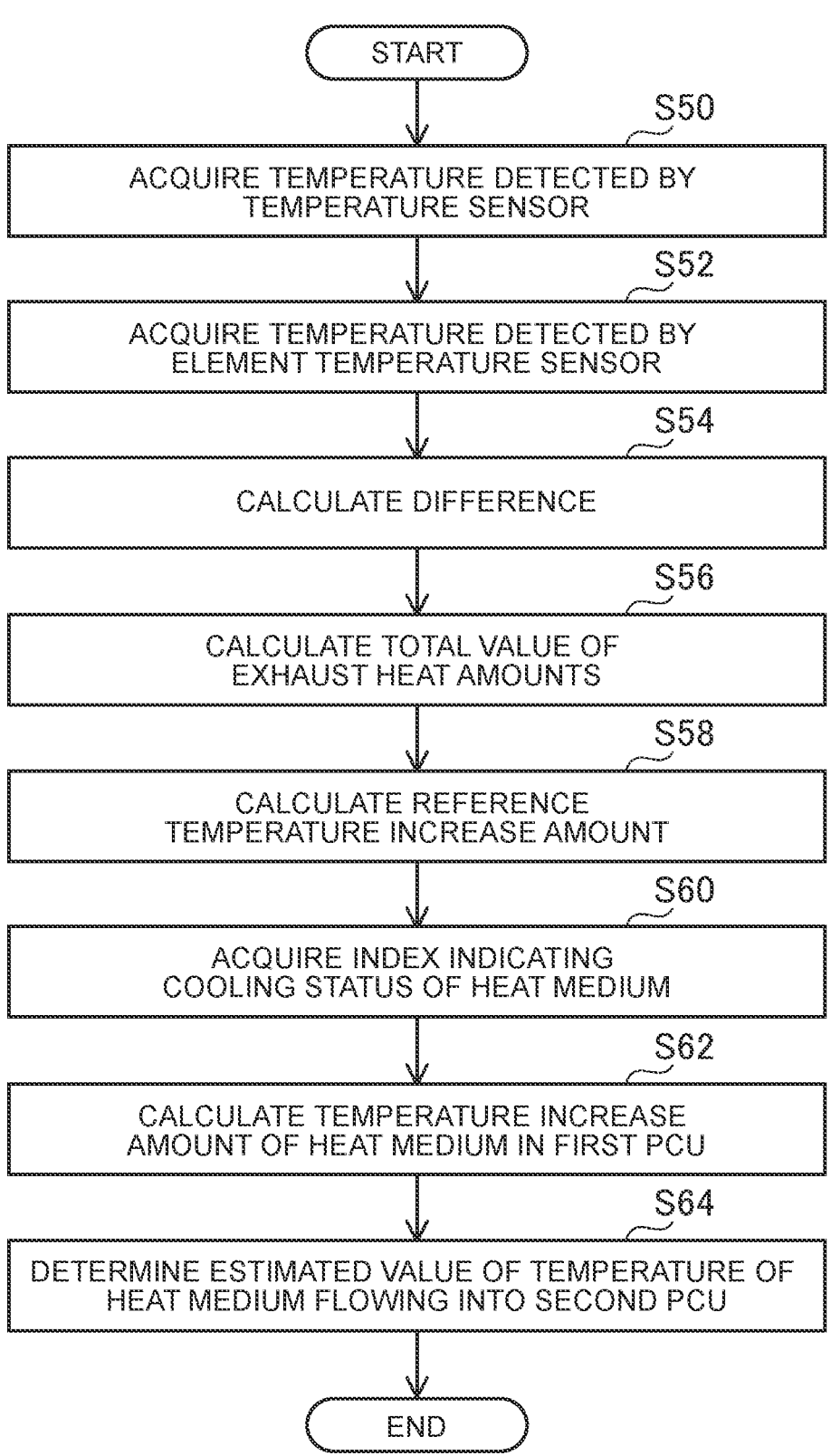
FIG. 6 is a flowchart showing a modification of the temperature estimation process to be executed by the cooling control device 20.

In the temperature estimation process shown in FIG. 6, the temperature increase amount of the heat medium in the first PCU 112 is calculated based on the actual temperature detected in the first PCU 112. The temperature estimation process of FIG. 6 is a modification of a part of the temperature estimation process shown in FIG. 4, specifically, the process of calculating the reference temperature increase amount in the first PCU 112 (that is, the process of Steps S12 and S14). Therefore, Steps S52 to S58 of FIG. 6 will mainly be described below. Steps S50 and S60 to S64 of FIG. 6 are the same as Steps S10 and S16 to S20 of FIG. 4.

In Step S52, the cooling control device 20 acquires an actual temperature detected by the element temperature sensor 118a. As described above, the element temperature sensor 118a is built in the semiconductor element 118 provided in the first PCU 112, and detects the temperature of the semiconductor element 118. In the present embodiment, each of the semiconductor elements 118 includes the element temperature sensor 118a. Therefore, each element temperature sensor 118a detects the temperature of the corresponding semiconductor element 118. The temperature detected by each element temperature sensor 118a is acquired by the cooling control device 20. The temperature of the semiconductor element 118 need not essentially be the value detected by the element temperature sensor 118a, and may be an estimated value obtained based on the operation status of the first PCU 112 including the semiconductor element 118 or the like.

In Step S54, the cooling control device 20 calculates a difference between the temperature of the semiconductor element 118 and the temperature of the heat medium flowing into the first PCU 112 (hereinafter simply referred to as "difference"). Specifically, the difference is calculated by subtracting the temperature detected by the temperature sensor 18 acquired in Step S50 from the temperature detected by the element temperature sensor 118a acquired in Step S52.

In Step S56, the cooling control device 20 calculates the total value of exhaust heat amounts of the semiconductor elements 118. For each of the semiconductor elements 118, the area of the semiconductor element 118 is multiplied by the difference calculated in Step S54 to obtain the exhaust heat amount of each semiconductor element 118. For all the semiconductor elements 118, the exhaust heat amounts of the semiconductor elements 118 are summed to obtain the total value of the exhaust heat amounts of the semiconductor elements 118.

In Step S58, the cooling control device 20 calculates a reference temperature increase amount. The reference temperature increase amount is calculated by multiplying the total value of the exhaust heat amounts of the semiconductor elements 118 by a predetermined conversion coefficient. The predetermined conversion coefficient may be an experimentally determined value or a value determined based on a predetermined procedure or calculation formula. Although there is no particular limitation, the cooling control device in the present embodiment prestores the predetermined conversion coefficient.

Next, the cooling control device 20 acquires a cooling index indicating the cooling status of the first PCU 112 using the heat medium, for example, the flow rate of the heat medium (Step S60), and calculates a temperature increase amount of the heat medium in the first PCU 112 (Step S62). Then, the cooling control device 20 determines an estimated value of the temperature of the heat medium flowing into the second PCU 114 (Step S64).

In the above configuration, it is considered that the heat generated from the semiconductor element 118 has a great effect on the temperature increase of the heat medium during the operation of the first PCU 112. In the series of steps in the temperature estimation process shown in FIG. 6, the temperature increase amount of the heat medium in the first PCU 112 is calculated based on the actual temperature detected by the element temperature sensor 118a built in each semiconductor element 118 provided in the first PCU 112. According to such a configuration, the computation load on the cooling control device 20 can be reduced by specifying the component to be taken into consideration when calculating the temperature increase amount of the heat medium in the first PCU 112.

While some specific examples are described in detail above, these are only exemplary, and are not intended to limit the scope of the claims. The technology defined in the claims includes various modifications and alterations of the specific examples described above. The technical elements described herein or in the drawings exhibit their technical usefulness alone or in combination.

What is claimed is:

1. A cooling system configured to cool a first unit and a second unit, the cooling system comprising:

a cooling path through which a heat medium flows in an order of the first unit and the second unit;

a temperature sensor configured to detect a temperature of the heat medium flowing into the first unit; and a control device connected to the temperature sensor and configured to execute a temperature estimation process for estimating a temperature of the heat medium flowing into the second unit, wherein the temperature estimation process includes:

a process of acquiring the temperature detected by the temperature sensor;

a process of calculating a temperature increase amount of the heat medium in the first unit based on at least one of heat generation indices of a torque target value to be output by a front motor associated with the first unit and at least one of cooling indices indicating a cooling status of the first unit using the heat medium, wherein the at least one of heat generation indices includes an operation command value that includes the torque target value to be output by the front motor; and a process of determining an estimated value of the temperature of the heat medium flowing into the second unit by adding the calculated temperature increase amount to the temperature detected by the temperature sensor, wherein the control device is configured to control operations of the first unit and the second unit based on the determined estimated value of the temperature of the heat medium flowing into the second unit.

2. The cooling system according to claim 1, wherein the first unit is a power conversion device configured to control electric power to be supplied to the front motor.

3. The cooling system according to claim 2, wherein the process of calculating the temperature increase amount of the heat medium in the first unit is further based on:

an operation parameter correlated to a power loss in the first unit, the operation parameter includes at least one of an input voltage to the power conversion device, an output current of the power conversion device, a carrier frequency of the power conversion device, and a control mode of the power conversion device.

*  *  *  *  *